United States Patent [19]

Tani et al.

[11] Patent Number: 4,877,565
[45] Date of Patent: Oct. 31, 1989

[54] METHOD OF MANUFACTURING CIRCUIT COMPONENT SUCH AS STATOR FOR VARIABLE RESISTOR

[75] Inventors: Hiroji Tani; Tohru Kasanami; Tsutomu Yokoi, all of Kyoto, Japan

[73] Assignee: Murata Manufacturing Co., Ltd., Japan

[21] Appl. No.: 209,290

[22] Filed: Jun. 20, 1988

[30] Foreign Application Priority Data

Jun. 19, 1987 [JP] Japan ................................ 62-153637
Jun. 20, 1987 [JP] Japan ................................ 62-154195

[51] Int. Cl.$^4$ ............................................. B29C 45/14
[52] U.S. Cl. ......................................... 264/105; 29/620;
156/238; 264/135; 264/272.18
[58] Field of Search .............. 264/135, 272.18, 272.19,
264/272.20, 272.15, 272.17, 272.11, 61, 104,
105; 29/620; 156/230, 238

[56] References Cited

U.S. PATENT DOCUMENTS

| | | | |
|---|---|---|---|
| 1,985,166 | 12/1934 | Haroldson | 264/105 |
| 3,085,295 | 4/1963 | Pizzino et al. | 264/272.17 |
| 3,662,317 | 5/1972 | Digirolamo et al. | 29/620 |
| 4,334,352 | 6/1982 | Van Benthuysen | 29/620 |
| 4,337,182 | 6/1982 | Needham | 264/272.17 |

Primary Examiner—James Lowe
Attorney, Agent, or Firm—Ostrolenk, Faber, Gerb & Soffen

[57] ABSTRACT

A method of manufacturing a stator for a variable resistor comprises a step of preparing a heat resistant film, a step of providing a resistor film on the heat resistant film, a step of obtaining a transfer sheet by treating the resistor film provided on the heat resistant film with a silane coupling agent, a step of preparing a forming die having a cavity for forming a substrate, a step of locating the transfer sheet in the forming die to expose at least a part of the resistor film in the cavity, a step of introducing resin into the cavity to form a substrate joined with at least a part of the resistor film and a step of separating the heat resistant film from the substrate to leave the resistor film.

11 Claims, 6 Drawing Sheets

FIG. 1
FIG. 2
FIG. 3
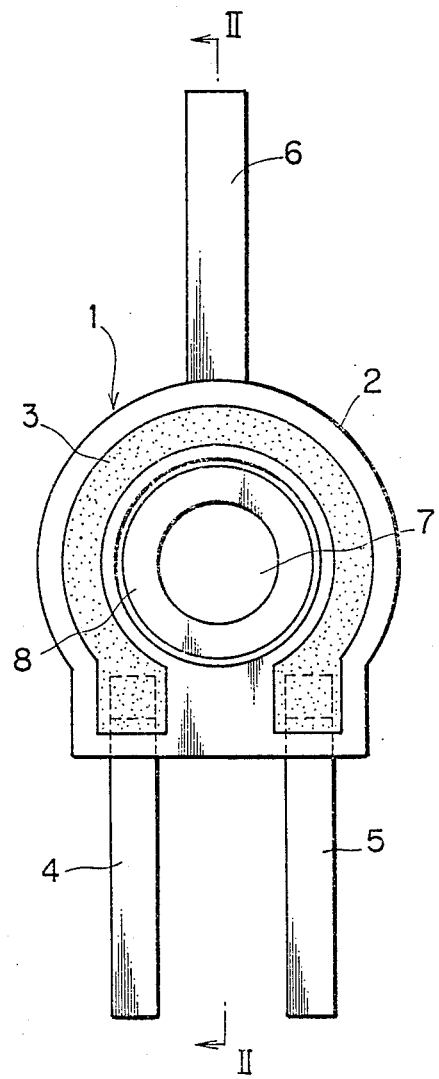
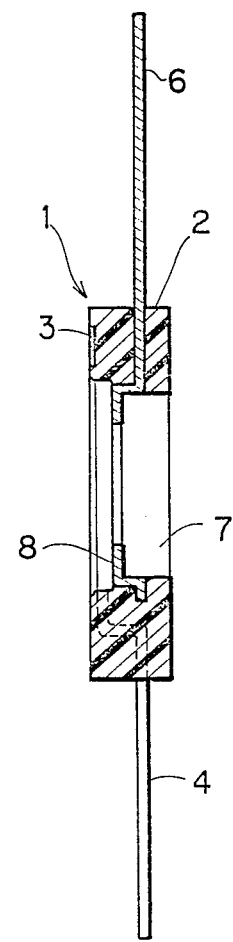
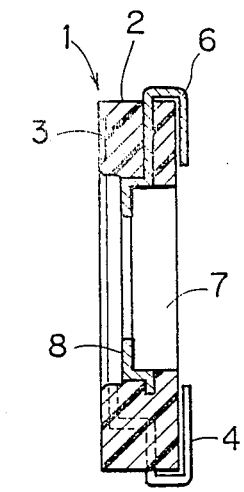

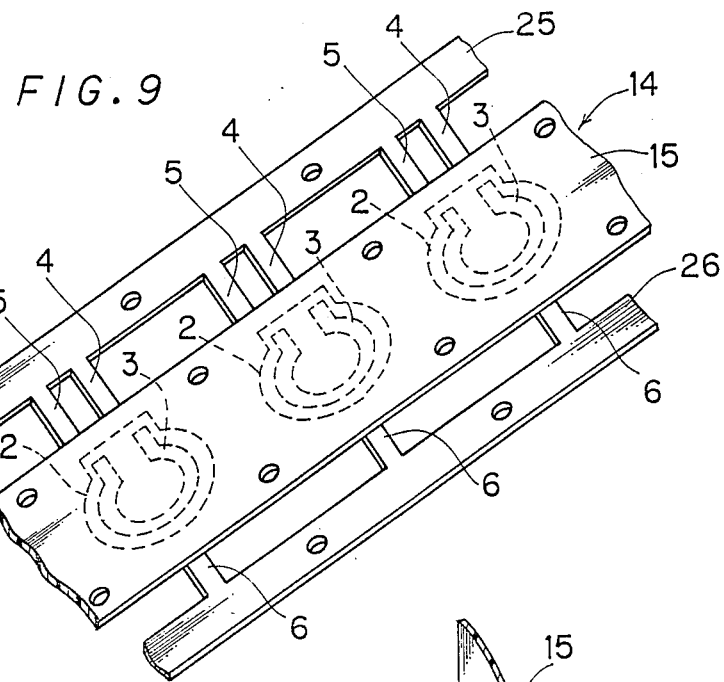
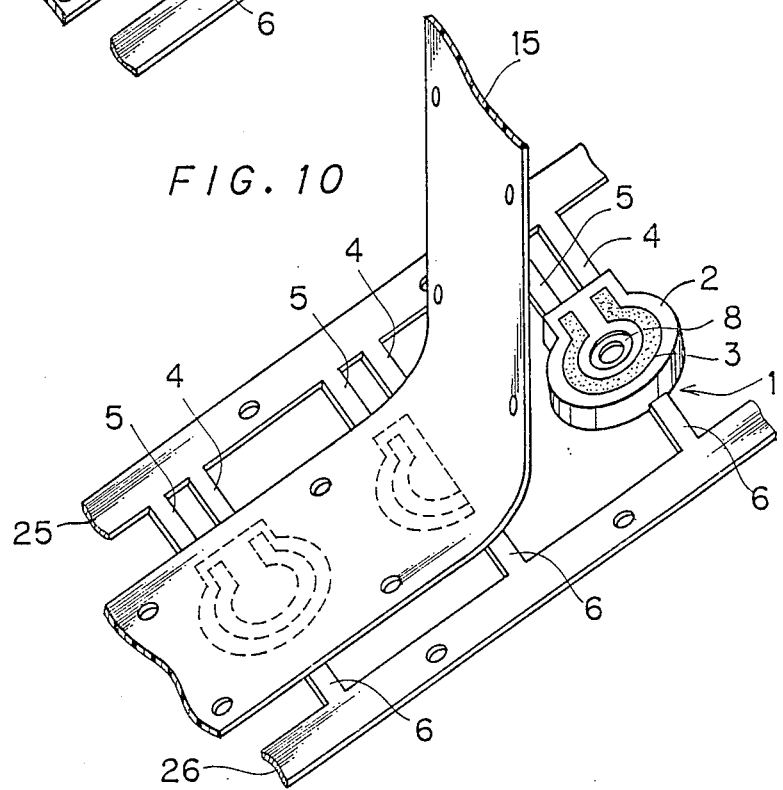

METHOD OF MANUFACTURING CIRCUIT COMPONENT SUCH AS STATOR FOR VARIABLE RESISTOR

BACKGROUND OF THE INVENTION

1. Field of the Invention

The present invention relates to a method of manufacturing a circuit component such as a stator for a variable resistor, which comprises a film electrical element such as a resistor film, a conductor film or the like, for example, provided on the surface of a substrate. More particularly, it relates to a method of forming the film electrical element on the surface of the substrate.

2. Description of the Prior Art

A film electrical element such as a resistor film or a conductor film is provided on the surface of a substrate of resin, for example, most typically by screen printing. Namely, paste prepared for forming a resistor or conductor film is applied onto the surface of a substrate by screen printing, thereby to provide a paste film of a desired pattern, which is then dried and thereafter fired. Thus, obtained is a circuit component which comprises a resistor film and/or a conductor film of desired pattern(s) provided on the surface of a substrate.

A typical example of a circuit component is a stator for a variable resistor, which stator generally comprises an electrical insulating substrate and a resistor film provided in a C-shaped configuration, for example, on its surface. On the other hand, the variable resistor comprises, as rotor structure, a brush which is brought into contact with the resistor film to slide along the longitudinal direction of the resistor film. The resistor film provided on the substrate in the aforementioned manner is easily separated from the substrate since the resistor film is merely adhered to the substrate substantially only by physical action. Such separation of the resistor film is particularly prompted by the brush which is brought into contact with the resistor film to slide along the same. The aforementioned problem is especially serious in a small variable resistor such as a chip-type variable resistor, since a resistor film provided on the substrate of such a small variable resistor is not much adhesive to the substrate because of its small area. Thus, particularly in a variable resistor, the aforementioned problem appears as reduction in so-called rotational life, such that the resistor film is separated from the substrate upon repetitive rotation of the brush.

SUMMARY OF THE INVENTION

Accordingly, an object of the present invention is to provide, in a method of manufacturing a circuit component comprising a substrate and a film electrical element provided on the surface of the substrate, an improvement for increasing adhesion between the substrate and the film electrical element.

Another object of the present invention is to provide a method of efficiently manufacturing a circuit component, which is improved in adhesion between a substrate and a film electrical element.

Still another object of the present invention is to provide a method of manufacturing a stator for a variable resistor, which can arbitrarily select composition of a resistor film without reducing adhesion between the resistor film and a substrate.

Provided according to the present invention is a method of manufacturing a circuit component which comprises a substrate of resin and a film electrical element formed on the surface of the substrate. This method comprises:

a step of preparing a first element for providing one of a substrate and a film electrical element in a solid state;

a step of treating the surface of the first element with a silane coupling agent;

a step of preparing a second element for providing the other on of the substrate and the film electrical element in a fluid state;

a step of applying the second element, being in a fluid state, on the surface of the first element treated with the silane coupling agent; and a step of hardening the second element being in contact with the surface of the first element.

When the first element provides a substrate, the second element provides a film electrical element. The element for the film electrical element is prepared in the state of fluid paste, which is applied to the surface of the substrate by screen printing, for example, and baked to form a desired film electrical element. In advance to the step of applying the paste for providing such a film electrical element, the surface of the substrate is treated with the silane coupling agent.

When the first element provides a film electrical element, on the other hand, the second element provides a substrate. In such case, the first element is generally prepared in the state of paste which is solidified by baking, so that a film of the paste is provided on an appropriate film and baked to solidify the film electrical element.

In a preferred embodiment of the present invention, a step of preparing a film electrical element comprises a step of preparing a heat resistant film and a step of providing a film electrical element on the heat resistant film, as disclosed U.S. Pat. No. 4,839,960 entitled "Method of Manufacturing Circuit Component such as Stator for Variable Resistor" in the name of Yokoi et al. Therefore, a step of treating the film electrical element with a silane coupling agent is performed while retaining the film electrical element on the heat resistant film. The substrate, being the second element, is preferably prepared by resin since the same must be in a fluid state at least in a certain point of time. Therefore, a step of hardening the substrate, being the second element, comprises a step of preparing a forming die having a cavity for forming a substrate; a step of locating the heat resistant film holding the film electrical element, being treated with the silane coupling agent, in the forming die to expose at least a part of the film electrical element in the cavity; and a step of introducing resin into the cavity to form a substrate which is joined with the said at least a part of the film electrical element. The heat resistant film is separated from the film electrical element after completion of its service as a carrier for transferring the film electrical element on the substrate.

According to a more specified aspect of the present invention, provided is a method of manufacturing a stator for a variable resistor, which comprises a substrate of resin and a resistor film provided on the surface of the substrate.

A silane coupling agent employed in the present invention is prepared by organic silicon monomer having two or more reaction groups, which are different from each other, in its molecule. One of the reaction groups is selected from methoxy group, ethoxy group and silanol group, for example, which are chemically bonded with inorganic substances, and the other one is selected from reaction groups such as vinyl group, epoxy group, meta-acrylic group, amino group and mercapto group, which are chemically bonded with organic substances such as various synthetic resin materials. Thus, the silane coupling agent typically chemically bonis inorganic and organic substances with each other by the reaction groups contained therein. The silane coupling agent is further incidentally adapted to chemically bond inorganic substances themselves and organic substances themselves with each other.

Thus, the silane coupling agent is adapted to chemically strongly bond an organic substance such as resin and/or an inorganic substance such as alumina contained in the substrate with organic substances such as binder resin and an organic filler and/or inorganic substances such as metal and an inorganic filler contained in the film electrical element, as well as to chemically strongly bond the organic and inorganic substances such as the metal, inorganic filler, organic filler and binder resin themselves, which are contained in the film electrical element itself. Therefore, the substrate and the film electrical element are not only physically but also chemically bonded with each other to attain strong adhesion between the same, while the fiLm electrical element itself is improved in strength. Thus, the film electrical element is prevented from partial rupture in the direction of its thickness upon separation of the heat resistant film while the resistor film is prevented from separation from the substrate caused by repetitive rotation of the brush.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a stator for a variable resistor, which is obtained by carrying out a method according to the present invention;

FIG. 2 is a sectional view taken along the line II—II in FIG. 1;

FIG. 3 is a sectional view corresponding to FIG. 2, showing lead terminals being in bent states;

FIG. 9 is a perspective view showing a state after forming of the substrate;

FIG. 10 is a perspective view showing a step of separating a heat resistant film from the substrate.

DESCRIPTION OF THE PREFERRED EMBODIMENTS

Figure 4:
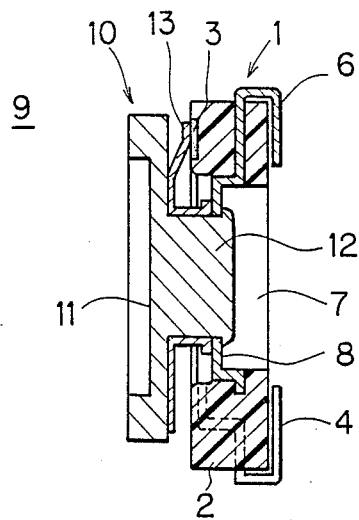
FIG. 4 is a sectional view showing a variable resistor completed by employing the stator as shown in FIG. 3.

Referring to FIGS. 1 and 2, a stator 1 for a variable resistor comprises a substrate 2 of resin and a substantially C-shaped resistor film 3 provided on the surface of the substrate 2. The resistor film 3 is so embedded in the substrate as to define a surface which is substantially flush with that of the substrate 2. Further, parts of lead terminals 4, 5 and 6 are buried in the substrate 2. Within the lead terminals 4, 5 and 6, the lead terminal 4 is electrically connected to an end of the resistor film 3 and the lead terminal 5 is electrically connected to the other end of the resistor film 3. A hole 7 is provided in a substantially central portion of the substrate 2. The lead terminal 6 is integrally provided with an annular collector 8, which inwardly extends from the inner peripheral surface of the hole 7.

Portions of the lead terminals 4, 5 and 6 outwardly extending from the substrate 2 may be respectively cut in appropriate lengths, to be bent along one surface of the substrate 2, as shown in FIG. 3. The stator 1 having the structure as shown in FIG. 3 is adapted to form a variable resistor, which can be face-bonded to a printed circuit board or the like.

FIG. 4 is a sectional view showing a variable resistor 9 which is obtained through the stator 1 as shown in FIG. 3. In addition to the stator 1, the variable resistor 9 includes a rotor 10, which comprises a rotary shaft 12 provided with an adjusting groove 11 and a brush 13. The brush 13 rotates with the rotary shaft 12, to slide along the surface of the resistor film 3. This brush 13 is electrically connected to the lead terminal 6 of the stator 1.

Description is now made on a method of manufacturing the stator 1.

Figure 7:
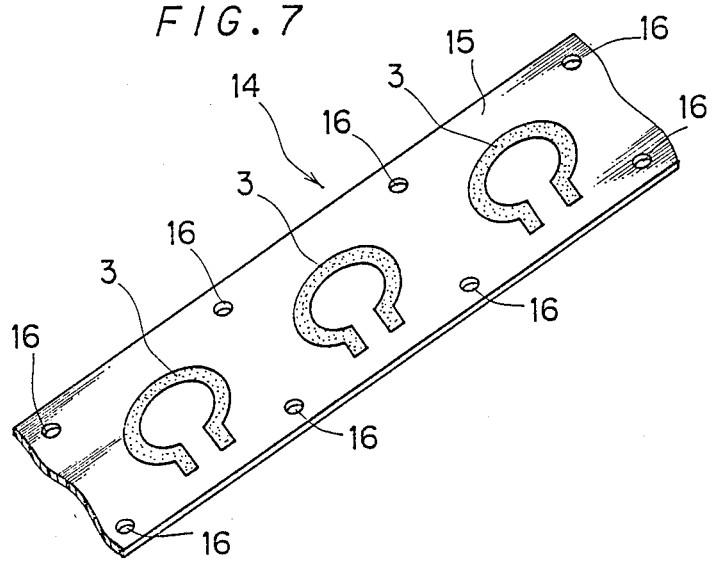
FIG. 7 is a perspective view showing a part of the transfer sheet.
Figure 5:
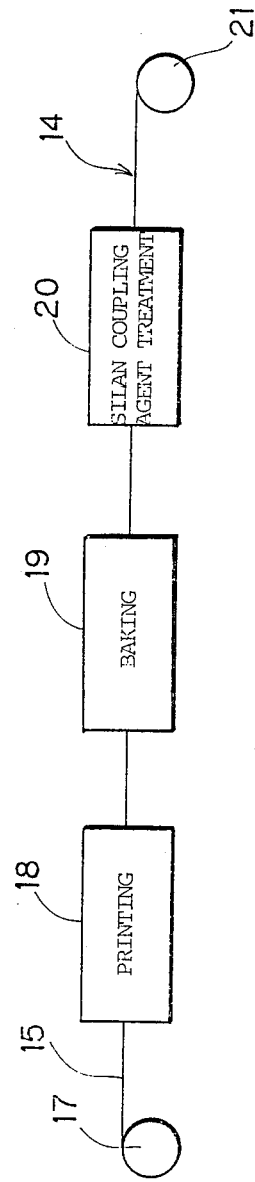
FIG. 5 illustrates the process of manufacturing a transfer sheet.

FIG. 7 shows a transfer sheet 14, which is obtained through the process as shown in FIG. 5. This transfer sheet 14 comprises a strip-shaped heat resistant film 15. Perforations 16 are provided at regular intervals on both side edges of the heat resistant film 15. The perforations 16 are adapted to reliably feed the heat resistant film 15 at regular intervals, as well as to locate the same in forming dies as hereinafter described. Resistor films 3 are provided on the surface of the heat resistant film 15. The resistor films 3, configurations of which are reverse to that shown in FIG. 1, are distributed at regular intervals along the longitudinal direction of the heat resistant film 15. The heat resistant film 15 is preferably formed of imide resin such as polyimide, which is excellent in heat resistance and dimensional stability. Alternatively, the heat resistant film 15 may be formed of a composite structure, which is prepared by stainless steel or aluminum foil coated with imide resin, for example.

Referring to FIG. 5, the heat resistant film 15 is prepared in a state wound on a reel 17, and delivered from the reel 17 to be taken up by another reel 21 sequentially through a printing station 18, a baking station 19 and a silane coupling agent treatment station 20.

First, resistive paste films corresponding to the resistor films 3 in configuration are provided on the heat resistant film 15 by screen printing in the printing station 18. The paste films are naturally dried or forcibly dried at a temperature of 150° C. for about five minutes, for example.

Paste for providing the resistive paste films contains an inorganic filler serving as a filler, in addition to a conductive component of carbon powder such as carbon black or graphite. The inorganic filler is prepared by silica, alumina, glass, talc, clay, aluminum hydroxide, titanium dioxide or Chinese white, for example. Further, an organic filler such as fluorine-contained resin may be contained as another filler, in addition to the inorganic filler. The conductive component and the filler(s) are bonded with each other by binder resin. The binder resin is prepared by epoxy resin, phenol resin, urethane resin, melanin resin, diallyl phthalate resin, ethylene propylene dieneterpolymers (EPDM), styrene butadiene rubbers (SBR) or the like. Further, a solvent for pasting a compound obtained by mixing the aforementioned materials is prepared by methanol, ethanol, toluene, terpineol, diethylene glycol monoethyl ether (EC), diethylene glycol monoethyl ether acetate (ECA) or the like.

Then, the heat resistant film 15 is introduced into an electric furnace, in the baking station 19, so that the paste films are baked to the heat resistant film 15. This baking step is performed at a temperature of 240–280° C. for about 15–60 minutes, for example. Upon completion of such baking, the resistor films 3 are provided by the paste films.

Then, the resistor films 3 provided on the heat resistant film 15 are treated with a silane coupling agent in the silane coupling agent treatment station 20. In this station, the silane coupling agent is generally diluted by a solvent such as methanol, ethanol, isopropyl alcohol, toluene or acetone, to be employed in the state of a solution of 0.1 to 10%. The heat resistant film 15 provided with the resistor films 3 is dipped in such a solution of the silane coupling agent for 60 seconds, for example, to be dried in an oven at a temperature of about 40–130° C. for about 10 minutes.

The silane coupling agent employed in the present invention is prepared by γ-glycidoxy propyltrimethoxysilane, β-(3,4-epoxycyclohexyl)ethyltrimethoxysilane, N-β(aminoethyl)-γ-aminopropyltrimethoxysilane, N-β(aminoethyl)-γ-aminopropylmethyldimethoxysilane, γ-mercaptopropyltrimethoxysilane or the like, for example.

Preferably checked before or after the aforementioned treatment with the silane coupling agent is whether or not resistance property of the resistor films 3 is within a desirable range. This is to confirm whether or not composition of the resistive paste employed to obtain the resistor films 3 and conditions of printing, drying and baking are adequate. Properties of the resistor films 3 are checked with respect to parts or all of the resistor films 3 provided on the heat resistant film 15. The heat resistant film 15 provided with the resistor films 3, properties of which are within a desired range, is taken up by the reel 21, to define the transfer sheet 14. Various types of such transfer sheets 11 are thus taken up by various reels 21 in response to the types of variable resistors to be obtained, thereby to immediately cope with replacement of variable resistors.

Figure 6:
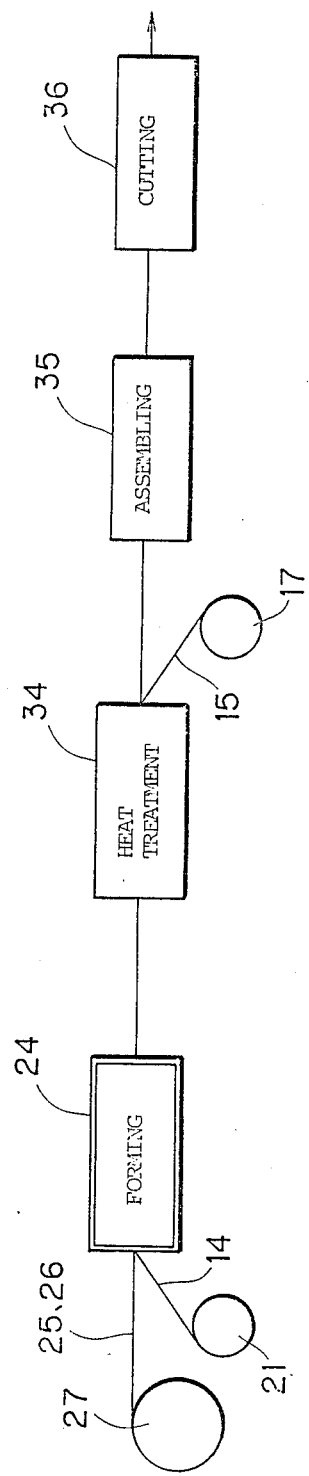
FIG. 6 illustrates the process of manufacturing a stator by employing the transfer sheet obtained through the process as shown in FIG. 5.
Figure 8:
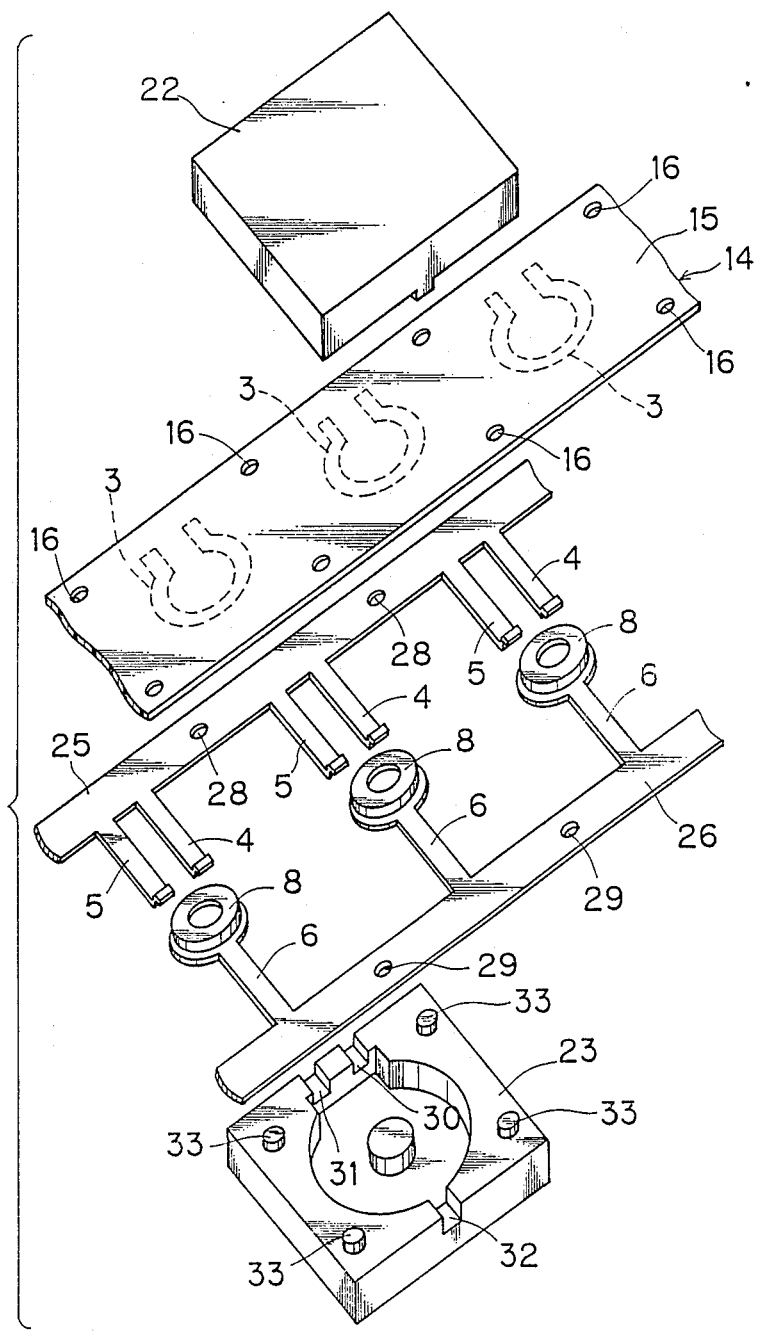
FIG. 8 is an exploded perspective view showing a step of forming a substrate included in the stator.

Then, as shown in FIGS. 6 and 8, the transfer sheet 14 delivered from the reel 21 and the lead terminals 4, 5 and 6 are received/located in cavities defined by forming dies 22 and 23, to perform a step of forming the substrates 2. This step is carried out in a forming station 24 as shown in FIG. 6. The lead terminals 4 and 5 are provided as parts of a hoop 25, while the lead terminals 6 are provided as parts of another hoop 26. The hoops 25 and 26 are wound on a reel 27. The hoops 25 and 26 are respectively provided with perforations 28 and 29, which are adapted to feed the hoops 25 and 26 at regular intervals, thereby to introduce the same into the cavities defined by the forming dies 22 and 23. The lead terminals 4, 5 and 6 are engaged in grooves 30, 31 and 32 provided in the forming die 23. On the other hand, the perforations 16 provided in the heat resistant film 15 receive projections 33 provided on the forming die 23, to locate the transfer sheet 14 on the forming die 23.

Upon such location of the transfer sheet 14 and the lead terminals 4, 5 and 6 in the forming die 23, the forming dies 22 and 23 are brought into contact with each other, to close the cavities defined by the same. Then, thermosetting resin such as diallyl phthalate resin is introduced into the cavities. Such diallyl phthalate resin is prepared in the form of powder or a tablet, which is softened or molten at a temperature of 80° to 100° C., to be introduced into the cavities defined by the forming dies 22 and 23 in this molten state. Then the resin is heated to a temperature of 160° to 180° C., to be hardened in the cavities. Alternatively, the powder or tablet of resin may be directly introduced into the cavities and thereafter increased in temperature to be molten and hardened in the cavities.

The resin is thus hardened to form the substrate 2, each of which is internally provided with the buried lead terminals 4, 5 and 6 and having the resistor film 3 and the heat resistant film 15 fixed to its surface.

Thus, the substrates 2 are successively formed by the forming dies 22 and 23 and discharged from the same in a series defined by the hoops 25 and 26 and the heat resistant film 15.

If necessary, the substrates 2 are subjected to heat treatment for breathing or the like, in a heat treatment station 34 as shown in FIG. 6.

Then, the heat resistant film 15 is separated from the substrates 2 as shown in FIG. 10. At this time, the resistor films 3 provided on the surface of the heat resistant film 15 are not separated from the substrates 2 since the same are embedded in the substrates 2 to be flush with the surfaces thereof, while being subjected to the action of chemical bonding by the silane coupling agent. The resistor films 3 maintain the properties measured in the state being held by the heat resistant film 15.

The heat resistant film 15 thus separated from the substrates 2 is again taken up by the reel 17, to be reusable.

Each substrate 2 separated from the heat resistant film 15 is fed to an assembling station 35, to be assembled with the rotor 10 as shown in FIG. 4.

Then, the lead terminals 4, 5 and 6 are cut from the hoops 25 and 26 in a cutting station 36, to provide the variable resistor 9 as a finished product. The lead terminals 4, 5 and 6 may be bent in order to obtain the variable resistor 9 as shown in FIG. 4.

Description is now made on Examples of the present invention based on the aforementioned embodiment.

EXAMPLE 1

A heat resistant film was prepared by a polyimide film of 50 μm in thickness, and resistive paste was screen-printed on the polyimide film, which was then introduced into an electric furnace, to fire the resistive paste on the film at 260° C. for one hour.

The resistive paste was prepared by mixing 50 wt.% of binder resin and 50 wt.% of a filler and carbon, adding 30 wt.% of α-terpineol, serving as a solvent, to the mixture and pasting the same. Surface roughness of a resistor film baked/provided on the polyimide film was 4 to 6 μm.

The polyimide film thus provided with the resistor film was dipped in a 0.5 % ethanol solution of γ-glycidoxy propyltrimethoxysilane, serving as a silane coupling agent, for 60 seconds and then dried in an oven at 40° C. for 10 minutes, to provide a transfer sheet.

Then, the transfer sheet treated with the silane coupling agent was fixed in a die of a compression molding machine, and thereafter molten resin was filled in the die to form a substrate. The die was at a temperature of 160 ±5° C. and the resin was filled at a temperature of 140 to 150° C., while preheating was performed for about 30 seconds. The filled resin was hardened under pressure of 100 kg/cm$^2$ (gauge pressure) for five minutes. The substrate taken out from the compression molding machine was thermally treated in an oven at 200° C. for four hours, and thereafter the polyimide film was separated from the substrate.

Table 1 shows the transfer rate and properties of the resistor film provided on the substrate, from which the polyimide film was separated. The transfer rate was 100 % as shown in the row of No. 1 in Table 1. The resistance value was 760 Ω and the temperature coefficient of resistance TCR was −312 ppm/°C. at −55° C. and −161 ppm/°C. at +125° C. with respect to the resistance value at 25° C. The temperature coefficient of resistance is expressed as follows:

$$TCR = \frac{R_t - R_0}{R_0} \times \frac{1}{t - t_0} \times 10^{-6} \text{ ppm/°C.}$$

wherein $t_0$: +25° C., $R_0$: Resistance value at $t_0$, and $R_t$: Resistance value at t.

The rate of change in resistance value, measured indoors after leaving the sample at 60° C. under relative humidity of 95% for 1000 hours, was −5.6%, while a measured value at 125° C. was −11%. Thus, obtained was a resistor film having a transfer rate of 100% and excellent properties.

EXAMPLE 2

A sample was prepared under conditions similar to those of Example 1, except for that particle size of carbon was reduced as compared with Example 1. As the result, a resistor film having a transfer rate of 100% and excellent properties was obtained as shown in the row of No. 2 in Table 1.

EXAMPLE 3

A sample was prepared under conditions similar to those of Example 2, except for that the ration of a filler to carbon was increased as compared with Example 2. Also in this Example, a resistor film having a transfer rate of 100% and excellent properties was obtained as shown in the row of No. 3 in Table 1.

EXAMPLE 4

A sample was prepared under conditions similar to those of Example 2, except for that particle size of carbon was further educed as compared with Example 2. Also in this Example, a resistor film having a transfer rate of 100% and excellent properties was obtained as shown in the row of No. 4 in Table 1.

EXAMPLE 5

A sample was prepared under conditions similar to those of Example 1 except for that ratio of binder resin to the mixture of carbon and a filler was 40:60. Also in this Example, a resistor film having a transfer rate of 100% and excellent properties was obtained as shown in the row of No. 5 in Table 1.

EXAMPLE 6

A sample was prepared under conditions similar to those of Example 1 except for that the ratio of binder resin to the mixture of carbon and a filler was 70:30. Also in this Example, a resistor film having a transfer rate of 100% and excellent properties was obtained as shown in the row of No. 6 in Table 1.

TABLE 1

| No. | Resin: Carbon + Filler | Transfer Rate % | Surface Roughness μm | Resistance | TCR ppm/°C. −55° C. | TCR ppm/°C. 125° C. | Rate of Change in Resistance % 60° C. 95% | Rate of Change in Resistance % 125° C. |
|---|---|---|---|---|---|---|---|---|
| 1 | 50:50 | 100 | 4–6 | 0.76 kΩ | −312 | −161 | −5.6 | −11 |
| 2 | 50:50 | 100 | 2–3 | 5.71 kΩ | −207 | +10 | −4.9 | −11 |
| 3 | 50:50 | 100 | 2–3 | 35.8 kΩ | −241 | −3 | −4.7 | −9 |
| 4 | 50:50 | 100 | 1–2 | 167 kΩ | −231 | +126 | −5.0 | −15 |
| 5 | 40:60 | 100 | 5–7 | 0.4 kΩ | −330 | +47 | −4.7 | −9 |
| 6 | 70:30 | 100 | 1–2 | 2.21 MΩ | −298 | +110 | −5.3 | −18 |

In general, surface roughness of a resistor film thus obtained is varied with particle size of carbon contained in the resistive phase as obvious from Example 1 compared with Examples 2 to 4. Further, such surface roughness is also varied with the content of the binder resin in the resistive phase. As obvious from Example 6 compared with Example 1, the surface of the resistor film is smoothed as the content of the binder resin is increased. On the other hand, the surface of the resistor film is roughened as the content of the binder resin is reduced, as obvious from Example 5 compared with Example 1.

The aforementioned surface roughness of the resistor film exerts influence on physical adhesion between the resistor film and the substrate. In other words, physical adhesion of the resistor film to the substrate is reduced as the surface of the resistor film is smoothed in each of Examples 2 and 3 as compared with Examples 1 and 5, and further smoothed in each of Examples 4 and 6. Thus, it is supposed that physical adhesion of the resistor film to the substrate is reduced in Example 2 or 3 as compared with Example 1 or 5, and further reduced in Example 4 or 6. However, all of Examples 1 to 6 have the transfer rates of 100%. This is supposedly because of an effect of the silane coupling agent. In order to substantiate such supposition, reference experiments were made with no treatment with the silane coupling agent. As the result, substantially no resistor film was transferred to a substrate in a sample corresponding to Example 6 in composition, although a sample corresponding to Example 1 had a transfer rate of 100%.

When the content of the binder resin is low as in Example 5, on the other hand, the resistor film is easily ruptured in the direction of its thickness in separation of the heat resistant film, since bond strength between particles of carbon and the filler contained in the resistor film is reduced. However, Example 5 presented the transfer rate of 100%, with no such rupture of the resistor film, supposedly also by an effect of the silane coupling agent. In order to substantiate such supposition, a reference experiment was made by transferring a resistor film corresponding to that in Example 5 in composition to a substrate with no treatment by the silane coupling agent and separating a heat resistant film. As the result, the resistor film was ruptured in the direction of its thickness. substantially over the entire region.

Thus, according to the present invention, the degree of freedom is increased in composition of the resistor film. In other words, the content of the binder resin contained in the resistor film, the particle size of carbon and the like can be relatively arbitrarily selected, whereby the material for the resistor film can be selected from a wide range while the range of a resistance value attained by the resistor film can be easily enlarged.

Figure 11:
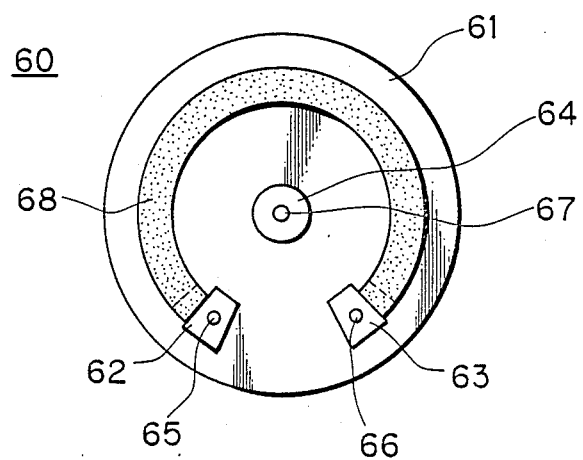
FIG. 11 is a plan view showing a stator for a variable resistor obtained according to another embodiment of the present invention.

FIG. 11 shows a stator 60 for a variable resistor, which is obtained by another embodiment of the present invention.

Referring to FIG. 11, the stator 60 comprises a substrate 61 of an inorganic insulating material such as alumina. This substrate 61 is provided on its one major surface with silver electrodes 62, 63 and 64, through firing. Metal terminals 65, 66 and 67 are electrically connected to the silver electrodes 62, 63 and 64 respectively. The respective ones of the terminals 65, 66 and 67 are derived toward the other major surface of the substrate 61, although the manner of such derivation is not shown in FIG. 11. Further, a substantially C-shaped resistor film 68 is provided on the said major surface of the substrate 61. Both end portions of the resistor film 68 are adapted to overlap with parts of the electrodes 62 and 63 respectively, to be electrically connected to the terminals 65 and 66 through the electrodes 62 and 63 respectively.

The structure of a rotor side of the variable resistor having the stator 60 as shown in FIG. 11 is not shown in the figure. A brush provided on the rotor is retained to be rotatable about the central axis of the substrate 61, such that a part thereof is brought into contact with the electrode 64 while another part slides along the surface of the resistor film 68.

In order to manufacture the aforementioned stator 60, the surface of the substrate 61 provided with the electrodes 62, 63 and 64 is first treated with a silane coupling agent, and thereafter resistive paste is printed to be then baked. In order to confirm an effect of treatment with the silane coupling agent in such a manufacturing method, an experiment was made as follows:

First, a substrate 61 of alumina was prepared and then silver electrodes 62, 63 and 64 were provided on the substrate 61 by firing. A silane coupling agent for treating the surface of the substrate 61 was prepared by a solution obtained by diluting γ-glycidoxy propyltrimethoxysilane to 0.5 wt.% by ethanol, and the substrate 61 was dipped in this solution to be then thermally treated at a temperature of 110° C. for 60 minutes.

Resistive paste was prepared by adding appropriate amounts of solvents prepared by α-terpineol and benzyl alcohol to a mixture of 7.20 wt.% of graphite, 4.30 wt.% of carbon black, 10.70 wt.% of an inorganic filler, 6.70 wt.% of an organic filler, 41.70 wt.% of epoxy resin, 24.73 wt.% of phenol resin, 4.59 wt.% of xylene resin and 0.08 wt.% of imidazole, and mixing and kneading the substance for one hour.

This resistive paste was screen-printed on the alumina substrate 61 treated with the silane coupling agent, and thermally treated at a temperature of 200 to 280° C. for 10 to 30 minutes, to provide a thick resistor film 68.

Table 2 shows properties of the resistor film 68 thus obtained. For the purpose of comparison, Table 2 also shows properties of a resistor film obtained with no treatment by the silane coupling agent.

TABLE 2

| | Treated with Silane Coupling Agent | Not Treated |
|---|---|---|
| Resistance | 85 kΩ | 87 kΩ |
| Resistance Dieperson % n:20, $\overline{X}$ | 15.6 | 16.4 |
| Separation Tape Test | Not Separated upon Wet Treatment for 250 hr. | Separated upon Wet Treatment for 24 hr. |
| Rotational Life Test | Not Separated | Separated |
| Moisture 24 hr. | +0.87 | +0.96 |
| Resistance (%) 500 hr. n:5, $\overline{X}$ | +1.84 | +1.92 |
| Heat 24 hr. | −1.86 | −1.92 |
| Resistance (%) 500 hr. n:5, $\overline{X}$ | −4.98 | −5.06 |

Referring to Table 2, "separation tape test" was made by leaving the stator at a temperature of 40° C. under relative humidity of 95% for a prescribed time, cutting the resistor film at intervals of 1 mm by a razor, adhering a commercially available cellophane tape to the resistor film and then separating the cellophane tape, to evaluate whether or not the resistor film was separated from the substrate with the cellophane tape.

"Rotational life test" was made by rotating the brush by 100 times one way (50 times both ways) while bringing the same into contact with the resistor film, to thereafter evaluate the state of separation of the resistor film from the substrate. In addition, in the sample treated with the silane coupling agent., the rate of change in resistance value was −2.11%, measured after the "rotational life test", while in the sample not treated with the silane coupling agent, the resistance value was not able to be measured because the resistor film was separated from the substrate.

"Moisture resistance" shows the rates of change (%) in resistance values of the resistor film measured after leaving the stator at a temperature of 40° C. under relative humidity of 95% for 24 hours and 500 hours respectively, with respect to an initial resistance value.

"Heat resistance" is expressed by evaluating the rates of change (%) in resistance values of the resistor film measured after leaving the stator under a temperature of 70° C. for 24 hours and 500 hours respectively with respect to an initial resistance value.

As obvious from Table 2, the resistor film was not separated in both of the "separation tape test" and the "rotational life test" in the sample treated with the silane coupling agent. In the sample not treated with the silane coupling agent, on the other hand, the resistor film was separated in both of the "separation tape test" and the "rotational life test". Thus, it is understood that treatment with the silane coupling agent extremely contributes to improvement in adhesion of the resistor film to the substrate.

In the process of the aforementioned experiment, the following optimum conditions were found with respect to treatment with the silane coupling agent:

A good effect of improving adhesion was obtained with treatment concentration of the silane coupling agent in a range of 0.1 to 10 wt.%, particularly 0.5 wt.%. Solderability to the electrodes (electrodes 62, 63 and 64) of Ag paste was deteriorated when the treatment concentration exceeded 10 wt.%.

As obvious from the aforementioned reaction mechanism of the silane coupling agent, chemical reaction of the silane coupling agent with the alumina substrate is formed by heating. The optimum heat treatment condition after dipping of the alumina substrate in an ethanol solution containing 0.5 wt.% of a silane coupling agent of γ-glycidoxy propyltrimethoxysilane was heating at a temperature of 110° C. for 60 minutes. Further, chemical reaction of the silane coupling agent with the resistor film is also formed by heating. Such heating is achieved when the resistor film provided on the alumina substrate, being reacted with the silane coupling agent, is baked. A good effect of improving adhesion was attained with a baking condition of heating the resistive paste film at a temperature of 200° to 280° C. for 10 to 30 minutes.

In the embodiment as shown in FIG. 11, the surface of the alumina substrate 61 may be treated with the silane coupling agent before the same is provided with the silver electrodes 62, 63 and 64. In this case, adhesion of the electrodes 62, 63 and 64 to the substrate 61 can also be improved by the silane coupling agent, in addition to that of the resistor film.

Although each embodiment of the present invention has been described in relation to a stator employed for a variable resistor, the present invention is not restricted to such a stator but applicable to a circuit component of any configuration and structure so far as its substrate is provided thereon with a film electrical element such as a resistor film and/or a conductor film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a circuit component comprising a substrate and a film electrical element provided on the surface of said substrate, said method comprising:
    a step of preparing a first element for providing one of a substrate and a film electrical element in a solid state;
    a step of treating the surface of said first element with a silane coupling agent;
    a step of preparing a second element for providing the other one of said substrate and said film electrical element in a fluid state;
    a step of applying said second element, being in a fluid state, on the surface of said first element being treated with said silane coupling agent; and
    a step of hardening said second element in a state being in contact with the surface of said first element.

2. A method in accordance with claim 1, wherein said first element is a substrate and said second element is a film electrical element.

3. A method in accordance with claim 2, wherein said substrate contains an inorganic material and said film electrical element contains an inorganic material and an organic material.

4. A method in accordance with claim 1, wherein said first element is a film electrical element and said second element is a substrate.

5. A method in accordance with claim 4, wherein said film electrical element contains an inorganic material and said substrate contains an organic material.

6. A method in accordance with claim 5, wherein said step of preparing said first element comprises a step of preparing a heat resistant film and a step of providing said film electrical element on said heat resistant film, and said step of treating said first element with said silane coupling agent is performed while retaining said film electrical element on said heat resistant film.

7. A method in accordance with claim 6, wherein said step of hardening said second element comprises a step of preparing a forming die having a cavity for forming said substrate, a step of locating said heat resistant film retaining said film electrical element, being treated with said silane coupling agent, in said forming die to expose at least a part of said film electrical element in said cavity, and a step of introducing resin into said cavity to form said substrate joined with said at least a part of said film electrical element, said method further comprising a step of separating said heat resistant film from said film electrical element joined with said substrate.

8. A method in accordance with claim 7, wherein said film electrical element contains an inorganic material and an organic material.

9. A method of manufacturing a stator, comprising a substrate of resin and a resistor film provided on the surface of said substrate, for a variable resistor, said method comprising:
    a step of preparing a heat resistant film;
    a step of providing a resistor film on said heat resistant film;
    a step of obtaining a transfer sheet by treating said resistor film provided on said heat resistant film with a silane coupling agent;
    a step of preparing a forming die having a cavity for forming a substrate;
    a step of locating said transfer sheet in said forming die to expose at least a part of said resistor film in said cavity;
    a step of introducing resin into said cavity to form a substrate joined with said at least a part of said resistor film; and
    a step of separating said heat resistant film from said substrate to leave said resistor film.

10. A method in accordance with claim 9, wherein said step of providing said resistor film comprises a step of applying paste including a resistor to said heat resistant film to provide a paste film and a step of baking said paste film.

11. A method in accordance with claim 10, wherein said paste contains carbon powder, binder resin and an inorganic filler.

* * * * *